United States Patent
Goth et al.

(10) Patent No.: US 6,968,709 B2
(45) Date of Patent: Nov. 29, 2005

(54) SYSTEM AND METHOD FOR COOLING MULTIPLE LOGIC MODULES

(75) Inventors: Gary F. Goth, Pleasant Valley, NY (US); Daniel J. Kearney, Ulster Park, NY (US); Kevin P. Low, Poughkeepsie, NY (US); Udo H. G. Meyer, Pfalzgrafenweg (DE); Scott B. Swaney, Caskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/724,847

(22) Filed: Dec. 1, 2003

(65) Prior Publication Data

US 2005/0115257 A1  Jun. 2, 2005

(51) Int. Cl.$^7$ .............................................. F25D 23/12
(52) U.S. Cl. ........................ 62/259.2; 713/322; 713/340
(58) Field of Search ..................... 62/259.2; 713/300, 713/322, 340; 702/132; 362/32; 326/32

(56) References Cited

U.S. PATENT DOCUMENTS

| | | | |
|---|---|---|---|
| 5,159,529 A | 10/1992 | Lovgren et al. | 361/699 |
| 5,239,200 A | 8/1993 | Messina et al. | 257/714 |
| 5,253,484 A * | 10/1993 | Corman et al. | 62/239 |
| 5,285,347 A | 2/1994 | Fox et al. | 361/385 |
| 5,752,011 A | 5/1998 | Thomas et al. | 395/556 |
| 6,058,012 A | 5/2000 | Cooper et al. | 361/704 |
| 6,135,200 A | 10/2000 | Okochi et al. | 165/121 |
| 6,252,771 B1 | 6/2001 | Jordan | 361/704 |
| 6,275,945 B1 | 8/2001 | Tsuji et al. | 713/300 |
| 6,305,463 B1 | 10/2001 | Salmonson | 165/80.3 |
| 6,362,960 B1 | 3/2002 | Ducourt et al. | 361/695 |
| 6,415,388 B1 * | 7/2002 | Browning et al. | 713/322 |
| 6,535,798 B1 | 3/2003 | Bhatia et al. | 700/293 |
| 2002/0075644 A1 | 6/2002 | Nakagawa et al. | 361/687 |
| 2003/0074591 A1 * | 4/2003 | McClendon et al. | 713/322 |
| 2005/0030171 A1 * | 2/2005 | Liu et al. | 340/500 |

* cited by examiner

*Primary Examiner*—Marc Norman
(74) *Attorney, Agent, or Firm*—Cantor Colburn LLP; William A. Kinnaman, Jr.

(57) ABSTRACT

A method and system of cooling hardware, sensing hardware, and supporting code streams that enables a non-redundant liquid cooling system to be used seemlessly in conjunction with an air cooling backup solution. The result offers system speed and reliability benefits of liquid cooling except for the brief occasions when the primary cooling system has failed and air cooling takes over. Until the liquid cooling is repaired, system clocks are automatically slowed to be compatible with the circuit speeds possible at the higher temperatures associated with air cooling. When the liquid cooling is repaired, the system clocks are automatically returned to their normal fast state. Depending on the circuit technology used, a supplied voltage may be varied while being air cooled.

10 Claims, 7 Drawing Sheets

SYSTEM AND METHOD FOR COOLING MULTIPLE LOGIC MODULES

FIELD OF THE INVENTION

This invention relates to a system and method to optimally match and adjust clock speed to specific circuit temperatures and voltage conditions present at any given moment in a liquid cooled system for cooling multiple logic modules.

BACKGROUND OF THE INVENTION

There are many circumstances where the cooling of CMOS logic circuits may degrade resulting in substantially higher operational junction temperatures. The temperature increase may be sufficient that the speed of the circuits and wiring reliably switch only if the clocks governing the switching speeds of these circuits are slowed.

There are numerous ways the temperature of specific logic components within a server may substantially increase in temperature; such as when air cooling and the ambient temperature rises dramatically as in the case of a failed air conditioning system; such as when the thermal conductive path between the logic devices and convective surfaces experience an increase in thermal resistance due to degradation of the thermal properties of the conductive path or improper assembly; such as when the quantity of airflow providing the air cooling drops dramatically due to debris clogging the fins of a heat sink or a fan failure; and such as computer applications that have very intensive switching factors resulting in much higher power generation while running that operation. Lastly, in which this invention is primarily concerned, this temperature change occurs when the primary means of cooling the logic circuits provides substantially lower junction temperatures than the secondary or backup means of cooling can provide and a switch between primary and secondary cooling modes occurs. A switch to the secondary means happens when the primary means of cooling using either refrigeration or water cooling is inadequate and the backup mode of air cooling is an attempt for redundant cooling.

The performance and reliability of high power CMOS circuits is improved using liquid cooling means such as refrigeration or water rather than air cooling. Non-redundant liquid cooling may help the circuits but the cooling system failure rate is too high for most electronics applications (e.g., servers) without a cooling backup.

Furthermore, the aggregated componentry of such configurations may occupy considerable volumes within their respective systems such that redundant liquid cooling is not possible. Because space is at a premium in most electronics applications, particularly as the size of the systems are reduced to keep pace with technological trends, cooling systems may be likewise reduced in size. In addition, higher end modules having increased density of electronic circuitry require redundant or backup cooling means in the event that the primary refrigeration cooling unit fails, while limiting the space needed to employ such a redundant or secondary cooling means.

Current methods of handling a significant degradation in observed logic temperatures for a single large change in cycle time includes cutting the clock speed in half. This method lowers the power being generated by the logic device sufficiently such that damage concerns due to high temperatures are eliminated. This approach is essentially simple thermal protection to prevent damage to the logic device. The prior art discloses essentially a high speed or low speed approach based on thermal protection concerns, and does not focus on operating the clock speeds at their optimal performance point all the way until thermal shutdown occurs for hardware protection.

SUMMARY OF THE INVENTION

The shortcomings of the prior art are overcome and additional advantages are provided through the provision of continually monitoring and controlling the temperature of all logic modules and of adjusting at least one of the voltage and the clock speed accordingly to maximize clock speeds and server performance for the given temperature conditions that the cooling solution is able to provide at any moment. In accordance with exemplary embodiments of the invention, a plurality of methods are disclosed to insure that in all these cases and at all operating times that the logic temperatures are sensed, adjusted if allowed by the cooling hardware capability, reported, and clock speeds and voltages are then adjusted to optimize server performance without risk of circuit failure due to switching too rapidly.

In an exemplary embodiment, three methods are disclosed that together with suitable cooling hardware and sensors enable a server with optimized performance characteristics.

In one embodiment, a method to control and monitor a hybrid cooling system for cooling multiple logic modules with different heat loads to the same temperature while maintaining system clock speeds as fast as viable is disclosed. The method comprises: cooling the multiple logic modules with a single refrigerant unit having a backup air cooling system; monitoring temperatures of any logic module subject to temperature changes; and controlling a first PID loop of electronic expansion valves in fluid communication with a corresponding evaporator, each expansion valve controlling the temperature of a corresponding logic module operating, each logic module having a heat load cooled by at least one of the single refrigerant unit and the backup air cooling system; and controlling a second PID loop of a compressor speed of the single refrigerant unit to extend refrigeration capacity and control for cooling multiple logic modules once an expansion valve has maximized a cooling capacity that the expansion valve can deliver.

In another embodiment, a method to determine a proper clock cycle time for multiple logic modules with different heat loads while maintaining the clock cycle time as fast as viable is disclosed. The method comprises: determining a thermal state of each logic module of the multiple logic modules, each thermal state defined by a discrete temperature range associated with a clock speed predetermined to be a proper clock cycle time for the temperature range; and determining whether a primary cooling means has been repaired. A backup air cooling fan is turned on if a temperature of any of the multiple logic modules are above acceptable levels of cooling by the primary cooling means.

In yet another embodiment, a method to initialize the logic clocks for multiple logic modules in a fail-safe parallel manner is disclosed. The method comprises: cooling the multiple logic modules with a hybrid cooling system, the hybrid cooling system includes a refrigerant unit as a primary cooling means and backup air cooling as a secondary cooling means; and issuing parallel "pre-cooling" commands to each logic module cooled by the refrigerant unit that allows the primary cooling means a head start in cooling prior to the logic clocks being turned on.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6 is a pressure versus enthalpy graph illustrating typical refrigerant cycles when system clocks are on.

The detailed description explains the preferred embodiments of the invention, together with advantages and features, by way of example with reference to the drawings.

DETAILED DESCRIPTION OF THE INVENTION

Figure 1:
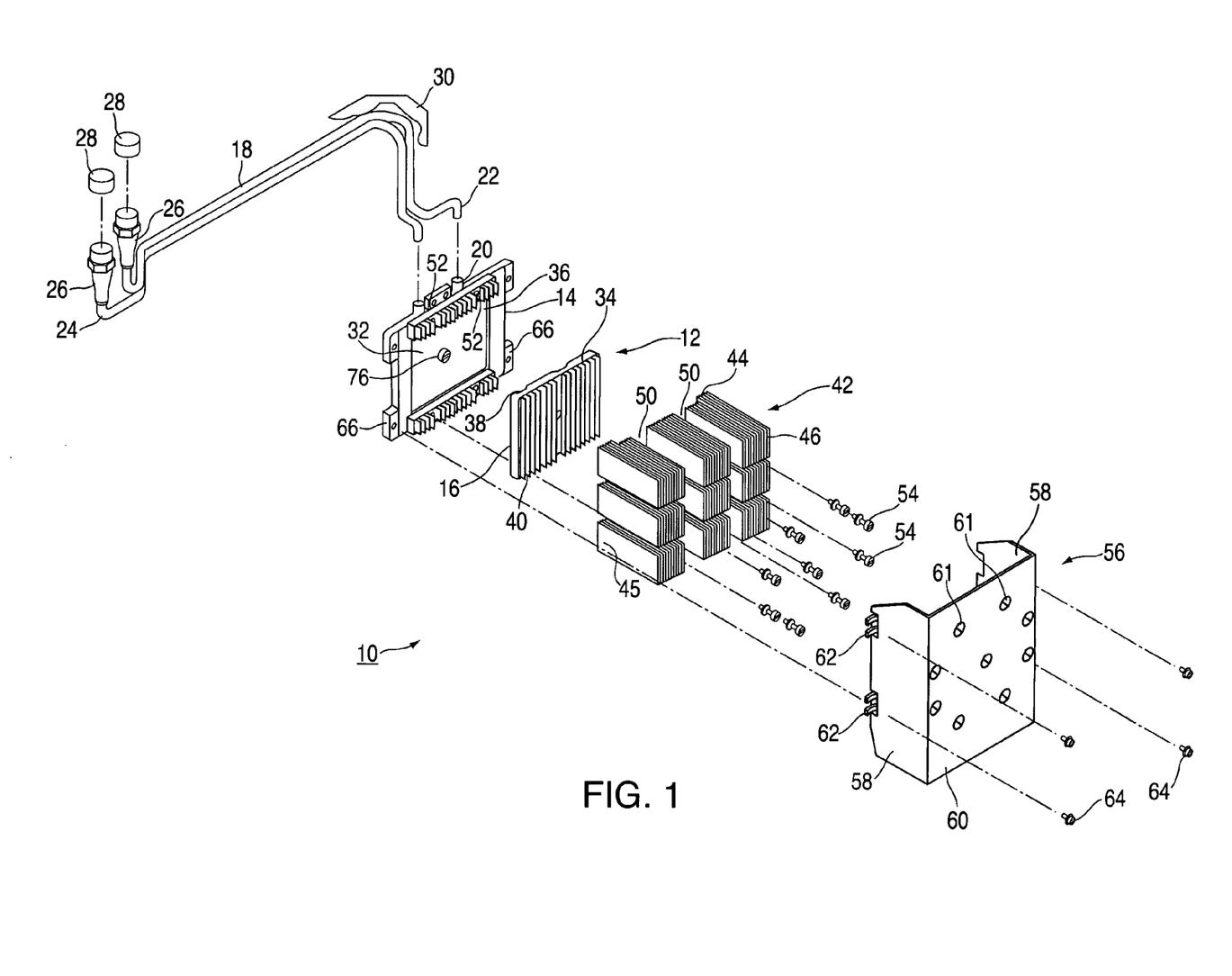
FIG. 1 is an exploded perspective view of an exemplary embodiment of an evaporator or coldplate and finned heat sink combination which attaches to the MCM hat when using a hybrid cooling solution in accordance with an exemplary embodiment of the invention.

Referring to FIG. 1, an exemplary embodiment of an integrated cooling unit is shown generally at 10 and is hereinafter referred to as "cooling unit 10." Cooling unit 10 provides for the removal of heat from electronic circuitry via circulation of a liquid coolant and the dissipation of the removed heat via forced convection of air. The circulation of the liquid coolant allows heat to be transferred to the coolant and subsequently removed by a fan, for example, that forces air over the circulating coolant. Although cooling unit 10 is described as being incorporable into computer-based applications in which heat is removed from electronic circuitry and dissipated through a fluid medium, it should be understood by those of skill in the art that cooling unit 10 may be utilized in other applications in which heat is generated and is to be dissipated to the surrounding environment. Furthermore, although cooling unit 10 is utilizes refrigerant R134A in a preferred embodiment as the circulating coolant, it should be understood by those of skill in the art that other liquids or fluids such as brine, alcohols, fluorocarbons, and halogenated hydrocarbons may be used.

Cooling unit 10 comprises an evaporator or cold plate shown generally at 12. Evaporator 12 includes a base plate portion 14 configured to receive a flow plate portion 16 of evaporator 12 therein and configured to receive and return coolant via a tubing arrangement 18. Tubing arrangement 18 at one end 22 is configured to be received by an inlet and outlet manifold 20 configured in base plate portion 14. Tubing arrangement 18 at another end 24 includes couplings 26 for coupling with a condenser or coolant reservoir (not shown). Coupling caps 28 are removably attached to an open end of each coupling 26 which is attached to each tube of tubing arrangement 18 to prevent debris from entering before installation or during shipment of cooling unit 10.

A portion of insulation material 30 is shown in FIG. 1 used to surround a length of tubing arrangement 18 to insulate liquid coolant in tubing arrangement 18 from ambient air outside tubing arrangement 18.

Flow plate portion 16 is received in a cavity 32 configured in base plate portion 14 to receive a complementary configured edge 34 of flow plate portion 16 defining its periphery. An inner surface 36 defining a bottom of cavity 32 is substantially planar to abut an outer surface 38 defining a bottom surface of flow plate portion 16.

On a top surface 40 opposite bottom surface 38 of flow plate portion 16, a heat sink assembly 42 is disposed. In an exemplary embodiment, heat sink assembly 42 includes an evaporator lid 44 having a plurality of parallel spaced heat sink fins 46 extending from a top surface 45 of lid 44. Evaporator lid 44 and plurality of heat sink fins 46 are preferably fabricated of copper, although other suitable thermally conductive materials may be employed. In addition, fins 46 are preferably nickel plated in the event of local condensation occurs over the coldest regions of evaporator 12. The plurality of heat sink fins 46 are preferably soldered or brazed to evaporator lid 44. Generally, the fin arrangement is stamped as a continuous piece from sheet metal having a high thermal conductivity value. Other exemplary materials from which fins 46 can be fabricated include, but are not limited to, copper alloys, aluminum, aluminum alloys, and combinations of the foregoing materials. An adhesive, such as a solder or a thermal epoxy compound, is optionally employed to attach the fin arrangement to lid 44.

Lid 44 includes a plurality of apertures 50 configured therethrough and aligned with corresponding apertures 52 configured in evaporator 12 for receiving corresponding fasteners 54 to secure heat sink assembly 42 to evaporator 12. It will be recognized that an area above each aperture 50 of lid 44 is vacated by the plurality of parallel spaced heat sink fins 46 to allow access of a tool (not shown) to the corresponding fastener and to allow air circulation of ambient air to a top surface of lid 44 in thermal contact with a top surface a evaporator 12.

A fin cover or shroud 56 is disposed opposite lid 44 having fin 46 therebetween. Shroud 56 is configured as a three-sided box structure having two sides 58 disposed at opposite ends and substantially perpendicular to a top cover 60. Shroud 56 is configured to protect fins 46 at an end portion and two sides thereof while allowing air flow to pass through fins 46 without limitation. Shroud 56 is configured with holes 61 in top cover 60 aligned with corresponding apertures 50 in lid 44 to provide access to fasteners 54, as well as provide additional air flow access through fins 46 substantially perpendicular to air flow through fins 46 between sides 58 of shroud 56. Each of the two sides 58 is further configured with a mounting means extending therefrom for attachment to base plate portion 14. In an exemplary embodiment, the mounting means includes a pair of flanges 62 extending from each side 58 and configured to engage a fastener 64 for engagement with a corresponding receiving flange 66 extending from base plate portion 14.

Figure 2:
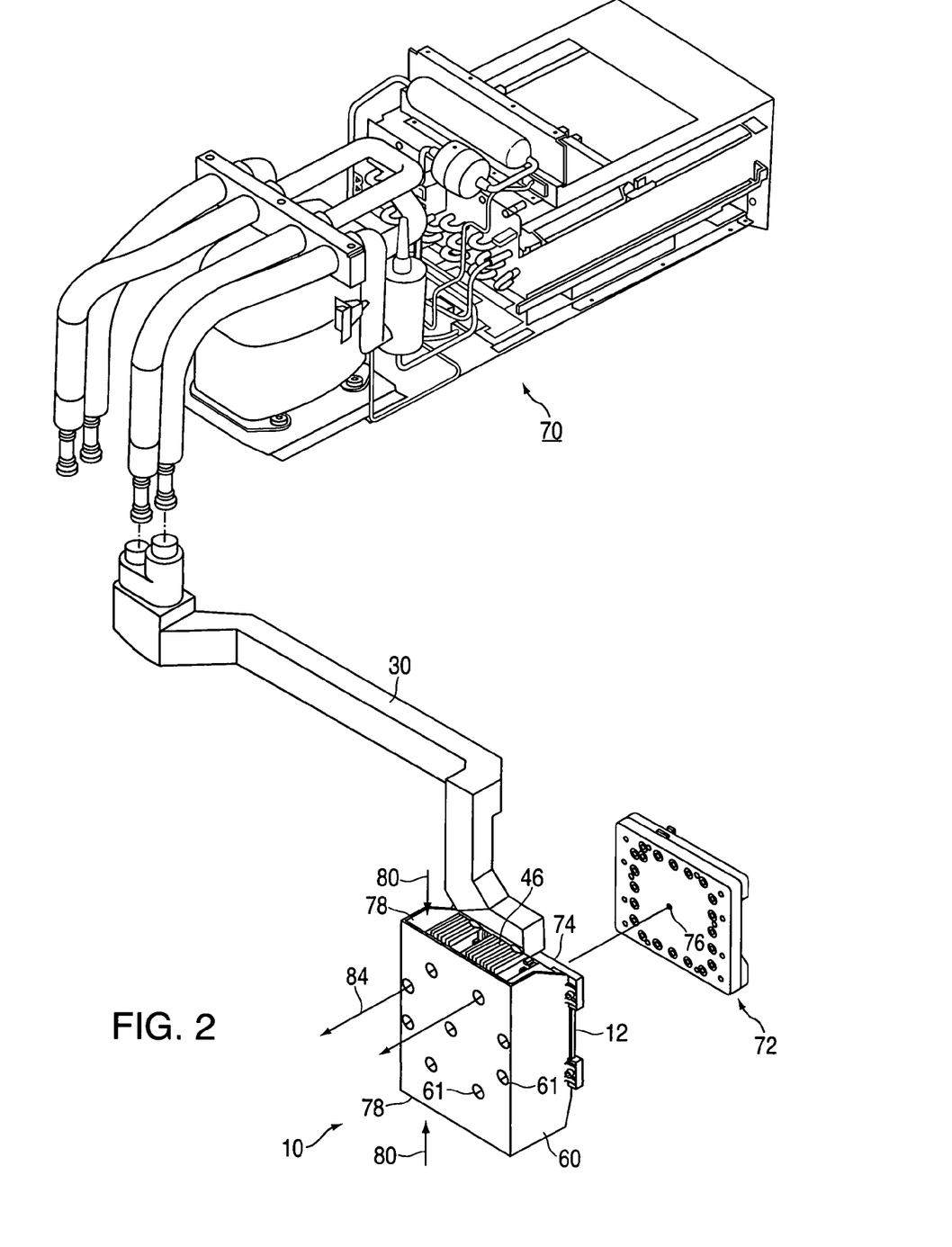
FIG. 2 is a perspective view of the evaporator unit in thermal communication with the backup air cooling unit of FIG. 1 assembled with insulation around inlet and outlet tubing to the evaporator unit and connected to a modular refrigeration unit (MRU)

Referring now to FIG. 2, cooling unit 10 of FIG. 1 is shown coupled with a modular refrigeration unit (MRU) 70 to provide coolant to evaporator 12 for cooling a processor module or multi-chip module (MCM) 72 interfacing an opposite surface 74 to inner surface 32 of base plate portion 14. MCM 72 is operably coupled to base plate portion 14 using a coupling means through a corresponding aperture 76 configured in MCM 74 and base plate portion 14 (See FIG. 1). The coupling means optionally includes one centrally located of nine fasteners 54 depicted in FIG. 1.

Still referring to FIG. 2, tubing arrangement 18 is encased with insulation 30 to insulate coolant from modular refrigeration unit (MRU) 70 to evaporator 12. In an exemplary embodiment, insulation 30 is fabricated of a polyurethane structural foam, however other suitable insulation materials are contemplated to aid in insulating coolant in tubing arrangement 18. In an exemplary embodiment, tubing arrangement 18 is fabricated with two 5/16 inch nitrogenized copper refrigeration tubing. Again, other suitable refrigeration tubing is contemplated suitable to withstand the pressures generated during operation of cooling unit 10 and the temperatures associated with the electronic circuitry. The tubing arrangement is optionally arranged as a coil to effectively optimize available space between MRU 70 and cooling unit 10.

As will be recognized by one skilled in the pertinent art, in one embodiment as shown, MRU 70 is configured to provide coolant flow through tubing arrangement 18 and manifold 20 to evaporator 12 to effect heat removal from MCM 72.

In order to facilitate the cooling when refrigeration as a primary cooling means is not operational, a secondary cooling means includes a flow of air from lid 44 to effect the removal of sensible heat from MCM 72 in thermal contact with lid 44. The arrangement of fins 46 is disposed over lid 44 facilitates air flow cooling of MCM 72. Each fin of the plurality of fins 46 extends a length defining a length of lid 44. Shroud 60 is disposed over fins 46 and extends over the height of cooling unit 10 and around outboard fins 46 disposed on opposite sides of lid 44. A pair of openings 78 defined by shroud 60 at opposite ends serves as a primary air inlet (shown with arrows 80). The primary air inlet allows air to be inducted within shroud 60 and fins 46. As discussed above, shroud 60 also includes a plurality of secondary air inlets through holes 61 (discussed as apertures with reference to FIG. 1) through which air is drawn in the directions of arrows 84, between adjacently positioned fins 46, and over lid 44. In an exemplary embodiment, the airflow pattern is directed from bottom to top, however, other airflow patterns are contemplated suitable for the desired end purpose.

Figure 3:
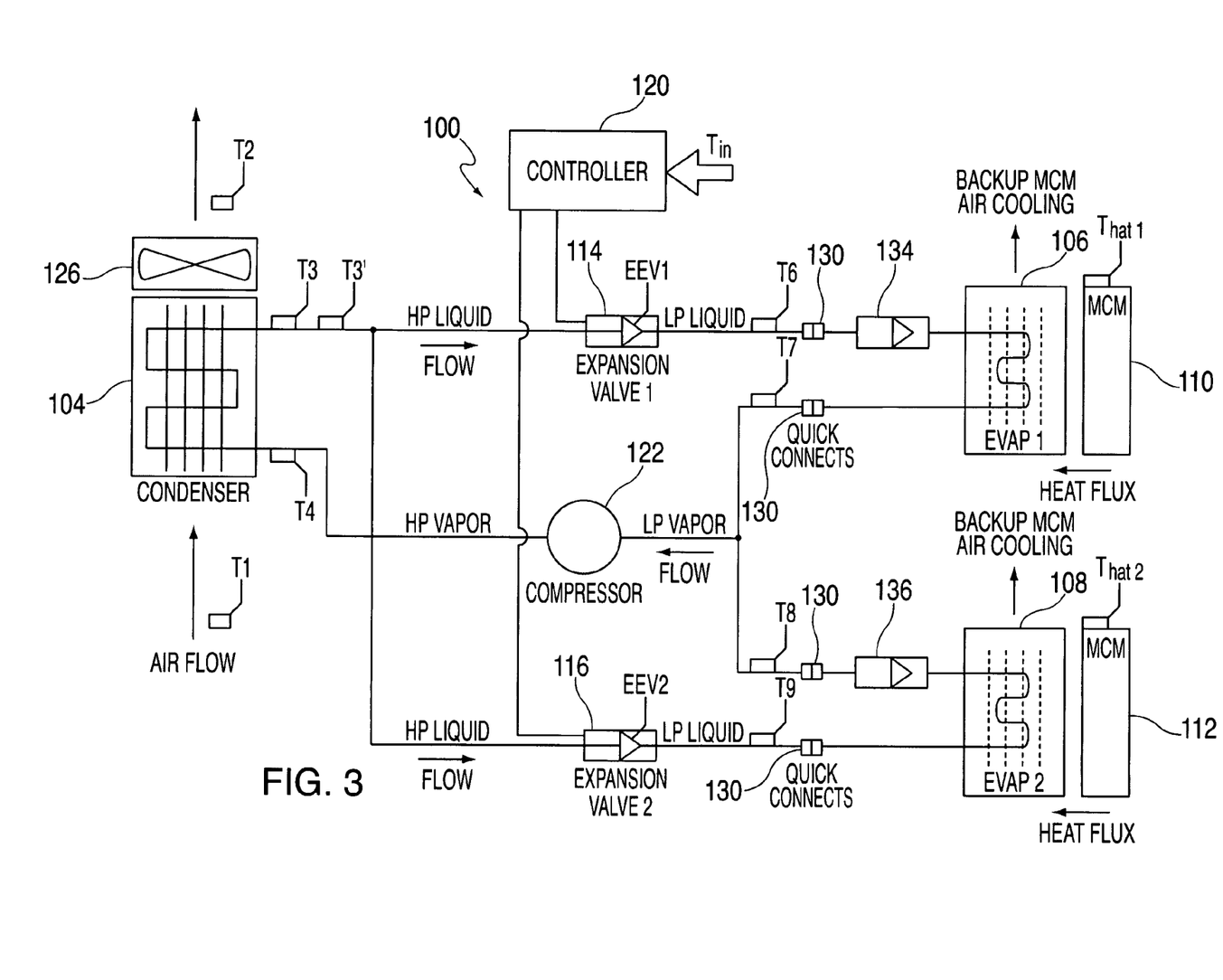
FIG. 3 illustrates one example of a schematic of the cooling system when using one MRU to cool two MCMs.

FIG. 3 depicts a cooling system 100 in an exemplary embodiment of the invention. Cooling system 100 includes a condenser 104 and two evaporators 106 and 108. Evaporators 106 and 108 cool logic modules 110 and 112, respectively. Logic modules 110 and 112 are multi-chip modules (MCMs) but it is understood that other logic modules (e.g., single processors, memory) may be cooled. As used herein, logic modules is intended to include a variety of electrical components.

Both evaporators 106 and 108 are supplied refrigerant from a common condenser 104. An expansion valve 114 receives high pressure liquid refrigerant from condenser 104 and generates low pressure liquid refrigerant to evaporator 106. An expansion valve 116 receives high pressure liquid refrigerant from condenser 104 and generates low pressure liquid refrigerant to evaporator 108. Expansion valves 114 and 116 are electrically controllable. A controller 120 provides control signals to expansion valve 114 and expansion valve 116 to control refrigerant flow and pressure drop across each expansion valve. In an exemplary embodiment, expansion valves 114 and 116 includes a stepper motor that responds to control signals from controller 120. The stepper motor opens or closes an orifice in the expansion valve to regulate refrigerant flow and pressure drop. Controller 120 executes a computer program to control the expansion valves 114 and 116.

The low pressure liquid refrigerant exits expansion valves 114 and 116 and is supplied to evaporators 106 and 108, respectively. The refrigerant in each evaporator 106 and 108 is converted to low pressure vapor refrigerant and provided to a common compressor 122. High pressure vapor from compressor 122 is supplied to condenser 104. Fan 126 establishes air flow across condenser 104 to facilitate cooling the high pressure vapor refrigerant to high pressure liquid refrigerant.

A plurality of temperature sensors are distributed throughout the cooling system 100. The sensors may be thermistors or other known temperature sensors. Sensor T1 measures air temperature entering condenser 104. Sensor T2 measures air temperature exiting condenser 104. Sensors T3 and T3' provide redundant measurement of refrigerant temperature exiting condenser 104. Sensor T4 measures refrigerant temperature entering condenser 104. Sensor T6 measures refrigerant temperature entering evaporator 106 and sensor T7 measures refrigerant temperature exiting evaporator 106. Sensor T8 measures refrigerant temperature entering evaporator 108 and sensor T9 measures refrigerant temperature exiting evaporator 108. Sensor That1 measures temperature at logic module 110 and sensor That2 measures temperature at logic module 112.

Each temperature sensor generates a temperature signal which is supplied to controller 120 and shown as Tin. The controller 120 adjusts the expansion valves 114 and/or 116 in response to one or more of the temperature signals to maintain the logic modules 110 and 112 at a predefined temperatures. Controller 120 controls expansion valves 114 and/or 116 to obtain desired superheat values while maintaining each logic module at a desired temperature. Each logic module 110 and 112 may be maintained at a different temperature or the same temperature, even if each logic module has different heat loads.

Evaporators 106 and 108 may be connected to the refrigerant supply and refrigerant return lines through quick disconnect connectors 130. The controllable expansion valves 114 and 116 allow an evaporator to be removed for maintenance or upgrade while the other evaporator, condenser and compressor continue to operate. For example, expansion valve 114 can be closed and the refrigerant from evaporator 106 removed by the suction of compressor 122. Evaporator 106 can then be removed for service, upgrade, etc.

In an exemplary embodiment in accordance with the invention, one embodiment joins methods to monitor and control the temperatures of logic modules 110, 112, to report the temperature state and to adjust the voltage levels appropriately and to adjust the various clock speeds which govern CMOS circuits that is effected by the change in temperature and/or voltage.

Figure 4:
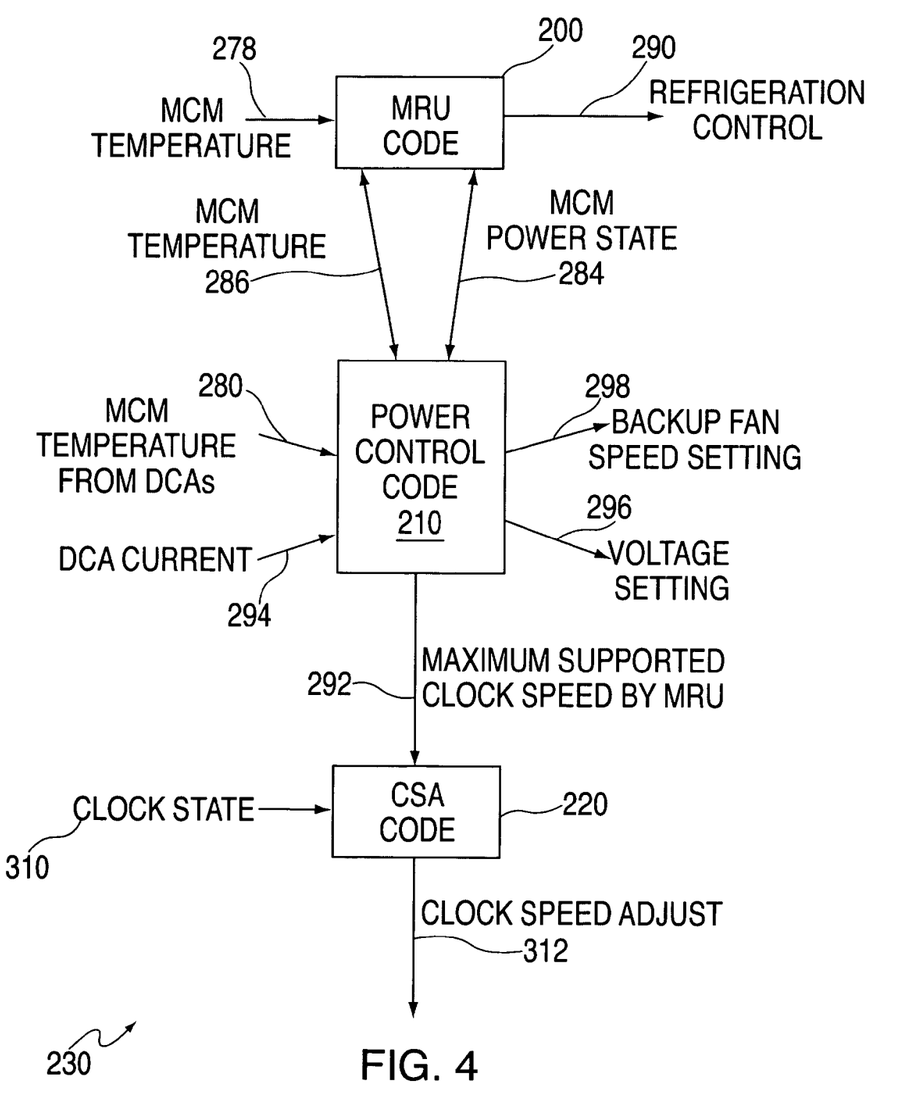
FIG. 4 illustrates a flow chart that shows how the Modular Refrigerant Unit (MRU) code which contains the method to monitor and regulate the MCM temperature under primary MRU cooling, the Power Control Code (PCC) which contains the method to determine and communicate the thermal state or range that equates to a specific temperature and voltage condition, and the Cycle Steering Application (CSA) code which contains the method of matching the various logic clocks to the thermal degrade state that exist, all three codes interacting in a single temperature-power-logic control system.

A detailed description of the method of monitoring and controlling the temperature of a hybrid cooling system 100 will now be described with reference to FIGS. 4 and 5. FIG. 4 illustrates a flow chart that shows how the Modular Refrigerant Unit (MRU) code 200 which contains the method to monitor and regulate the MCM temperature under primary MRU cooling, the Power Control Code (PCC) 210 which contains the method to determine and communicate the thermal state or range that equates to a specific temperature and voltage condition of each MCM, and the Cycle Steering Application (CSA) code 220 which contains the method of matching the various logic clocks to the thermal degrade state that exist. The MRU code, PCC code and CSA code, all interact into a single temperature-power-logic control system generally indicated at 230.

Figure 5:
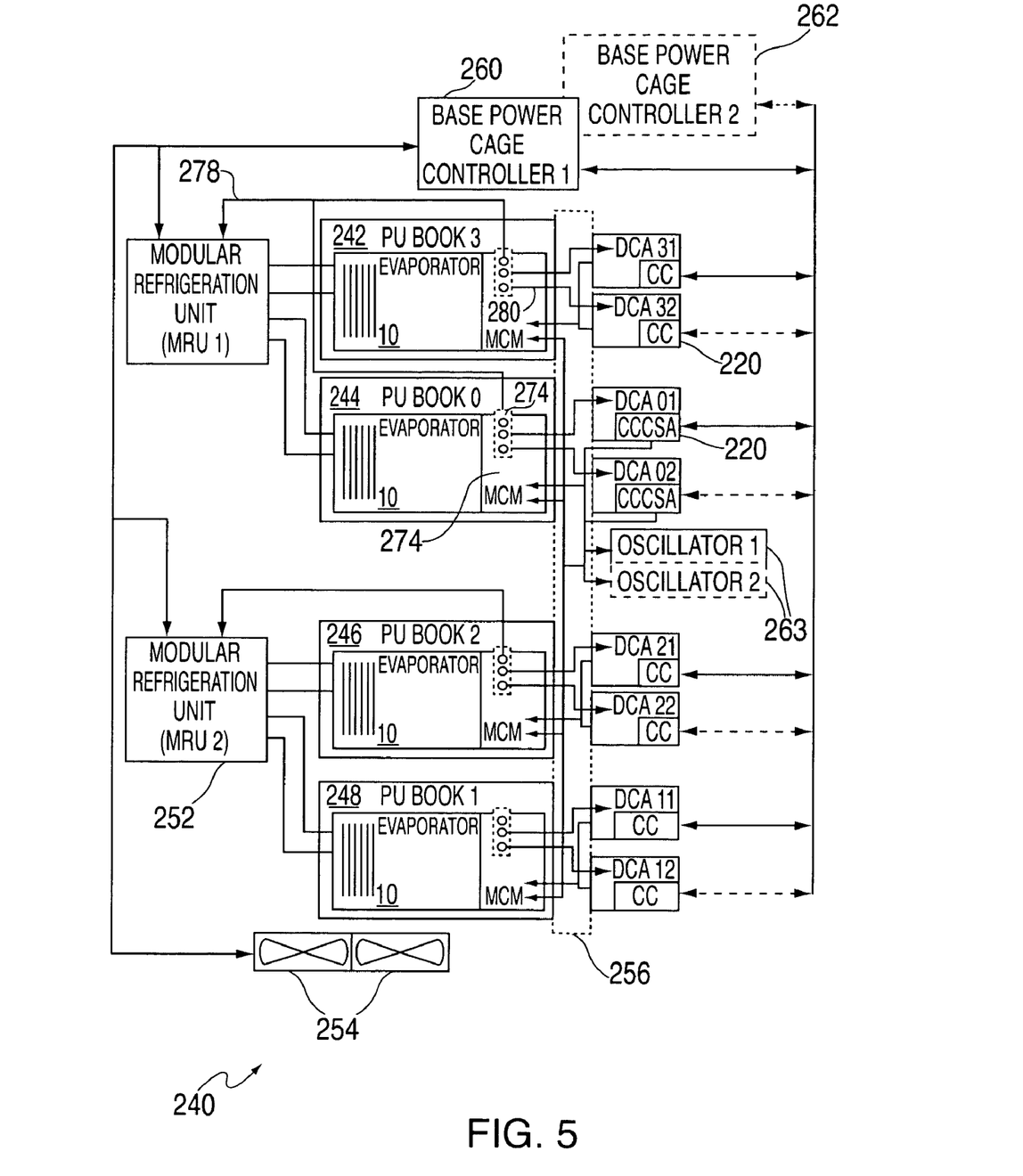
FIG. 5 shows a system schematic where the MRU code, the PCC code and the CSA code are physically located in a server having four Processor books or nodes, cooled in primary mode by two MRUs and in backup mode by blowers.

FIG. 5 shows a system schematic where the MRU code 200, the PCC code 210 and the CSA code 220 are physically located in a server that has four Processor (PU) books or nodes 242, 244, 246, 248, respectively, each having a logic module or MCM cooled in primary mode by one of two MRUs 250, 252 and in backup mode by two blowers 254. The back up blowers 254 provide air cooling for all PU books 242, 244, 246, 248, for MRU failures or a light logic load state. Each MCM is operably connected to a main system board generally indicated at 256. The MRU code 200 is in each MRU 250, 252. The PCC code 210 is split between Base Power Cage Controllers or Base Power Assembly 260, 262 and digital converter assemblies (DCA) cage controllers (DCA 01, 02, 11, 12, 21, 22, 31, 32). The Base Power Assembly 260, 262 provides high voltage DC power to the entire server 240 and the DCA converts the high DC power to low DC voltages used by each circuit. The CSA code 220 is located in the first Processor book 244 (labeled PU Book 0) of multi-node server 240.

Each MCM (not shown) in each PU book 242–248 includes a hat 274 in operable communication with a cooling unit 10 and connected to a thermal sensor assembly 276. Each thermal sensor assembly 276 preferably includes three thermistors configured to sense a temperature of a corresponding MCM.

The thermal sensors are compared for miscompare properties and for insanity limits to make sure the temperatures measured are accurate. One sensor is directly sensed by the Module Refrigeration Unit (or MRU) indicated generally at 278 and the other two are read by the power supply feeding the MCM power indicated generally at 280 to insure full redundancy and accuracy of this reading. The MRU reads an MCM hat thermistor sensor directly through its drive card to enable continual monitoring and thermal regulation in case of a cage controller failover. MCM hat thermistors that are read by each DCA power supply as well as by the MRU are compared to each other by the MRU and Power Control Code to identify any faulty sensors and eliminate the faulty sensors from consideration generally indicated at 286 in FIG. 4. This insures redundancy of control and cooling status function. The power supply thermistor also serves for thermal protection of the MCMs, dropping power if the temperatures are near damage limits.

The control of the primary cooling system is done by using a Proportional Integral Derivative (PID) control loop of an electronic expansion valve to each evaporator as described with reference to FIG. 3 and generally indicated at 290 in FIG. 4. The PID control loop regulates the coolant flow to each MCM being cooled. The coolant flow is increased by opening the electronic expansion valve if the MCM is too warm or is higher than targeted and the flow is reduced by closing the valve position if the MCM is too cold or cooler than targeted.

When the PID control has opened its electronic expansion valve to the fully open position providing maximum coolant to a given MCM, the compressor speed then executes its own PID control loop to deliver additional cooling capacity to the MCM. In other words, a second PID control loop controls the compressor speed if the valve regulating the flow of coolant to a respective evaporator has reached its maximum cooling position.

Similarly, the blower speed of blower 126 cooling the refrigerant condenser 104 is controlled by the cooling capacity needs from the MRU. More specifically, blower speed controls provide more air for cooling the MRU condenser 104 when the thermistors T1 and T2 on the condenser 104 and ambient air indicate that inadequate condensing is taking place. Also, the speed of condenser blower 126 is increased in a warm ambient.

Figure 6:
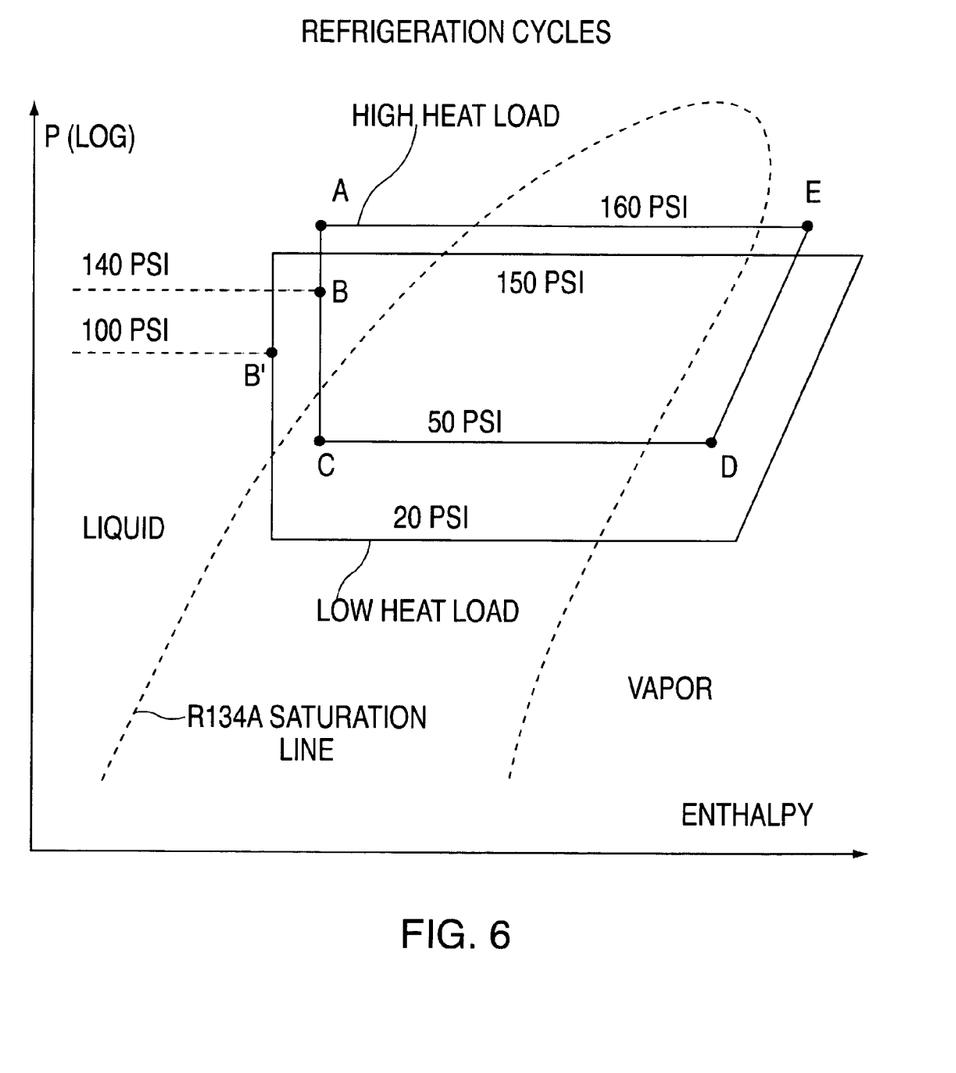

MCM power data 284, read by the Power Control Code 210 and provided to the MRU code 200 every 2.5 seconds, determines if a given MCM no longer has its clocks functioning. If the MCM power stays low, indicating a non-functional Processor book, for sufficient time, the refrigerant coolant supply is stopped by completely closing the expansion valve to that MCM only and turning on the backup blowers 254 at a reduced speed. In this manner other MCMs in the same server can stay refrigerant cooled while the MCM that has check stopped or otherwise ceased to function logically will be air cooled. Refrigerant cooling an MCM without adequate logic power can lead to condensation forming on its external surfaces. For example, when regulating light heat loads to a fixed temperature, the expansion device must significantly close the refrigerant flow rate, which lowers the pressure and hence the refrigerant temperature inside the evaporator cooling the MCM. This is suggested in the pressure versus enthalpy graph of FIG. 6 illustrating typical refrigerant cycles that still have clocks on. When the clocks are off, the expansion valve closes so far that the evaporator pressure may be sub-atmospheric which creates very cold local temperatures. These cold local temperatures with low heat flux and outside regions of the MCM can get cold enough to form condensate after extended operation in this condition.

The MRU code 200 also provides a function that enables virtually all of the refrigerant to be removed from the evaporator of a corresponding cooling unit before the refrigerant lines are opened for servicing the MCM or cooling hardware as discussed above with respect to FIG. 3. This is provided by closing the electronic expansion valves for some period before turning off the compressor, resulting in a partial vacuum that removes the refrigerant from the evaporator and connecting hoses. The benefits include better ecology and consistent refrigerant charge before and after the MRU is reconnected.

This temperature control code together with primary and/or secondary cooling hardware has the ability to program and run the MCMs at different or "biased" conditions to enable the MCM to be tested beyond the normal temperature conditions it sees in actual use. This temperature bias testing may be done while the logic voltage is also biased. In the prior art, these bias cooling functions required special tester cooling hardware and test code which was costly and inefficient compared to combining this stress test thermal function in the actual cooling system. Secondary cooling uses a PID loop also to achieve MCM temperature target that may be outside of the normal operating range.

Still referring to FIGS. 4 and 5, a detailed description of the Power Control Code (PCC) 210 which principally includes a method for monitoring the actual thermal or degrade state and for making suitable power and cooling adjustments, as well as reporting this state to the CSA code 220, now follows. The thermal states of each MCM are monitored and the state of each MCM are communicated to a function that determines the proper clock cycle time, called the Cycle Steering Application (CSA) code 220. This function tells the CSA code 220 both which cycle time range the circuits are now operating in and whether the cause of the failure of the primary cooling means has been repaired or not.

In particular, PPC 210 continually monitors and posts "cooling state" data to the CSA code 220 indicated generally at 292. The thermal state is defined by discrete temperature ranges that are associated with a given clock speed as the proper speed to operate. In other words, the full operating temperature range from coldest ambient to shutdown for thermal protection is subdivided into smaller discrete operating ranges. The coldest steady state temperature range is called the normal state, and is the temperature range kept under normal primary cooling means (e.g., MRUs 250, 252 and cooling units 10). When the primary cooling means no longer functions properly, the cooling state, sensed via the MCM sensors 276, is reported as a specific "degrade state". Preferably, there are between 2 and 4 degrade states between normal operation and thermal shutdown, but more or less are also contemplated and not limited to between 2 and 4. Within a given degrade state, there exists one "optimum" set of clock speeds.

The PCC 210 reads the actual current at 294 and voltage at 284 being supplied to each MCM as well as its temperature at 286. Based on the leakage characteristics of the CMOS technology, the capacity left in the power supply providing the current to the MCM, and operating temperatures, the PCC 210 may either increase or decrease or leave alone the applied voltage level to each set of circuits indicated generally at 296.

When the voltage is increased, the increased voltage enables a higher range of operating temperatures before a given degrade state is indicated to the CSA code 220 to slow the clocks. Hence the higher voltage can delay the need to operate in a slower clock range. This is because CMOS switches faster at higher voltages somewhat offsetting the slowing effects of warmer circuits.

Normally, it is desirable to increase voltage applied to the circuits to offset some of the slowing effect on circuit switching of warmer circuits. Typically a 6% increase in voltage will cause circuits to switch about 4% faster, offsetting a 25° C. temperature rise. However, with recent circuit technology, power increases strongly with higher temperature and increased voltage. In some cases it may require the voltage to be dropped when the junction temperature rises significantly, even though this lowering of voltage will increase the amount of slowing of the clock frequency that is needed. This disclosure includes all three voltage responses to loss of normal cooling: doing nothing, increasing voltage, and lowering voltage. A voltage alteration may be done to all modules in a system or just to specific logic modules that are exceeding normal cooling limits.

Under circumstances where additional leakage currents due to hotter CMOS circuit temperatures cause concern of either heating the MCM beyond its safe operating temperature range or requires additional current that the DCAs are unable to provide, the PCC 210 lowers the voltage applied to the CMOS circuits when a temperature degradation occurs. The effect on the "cooling degrade state" is to hasten its arrival as the combination of lower voltage and warmer circuits requiring faster clock speed adjustments.

The PCC 210 takes into account both the MCM temperatures and applied voltage when it notifies the CSA code 220 of a change in "cooling state". The PCC 210 continually monitors the MCM thermistors 276 and provides the MRU with information if a sensor value is erroneous as well as the actual good values.

The PCC 210 sends the message to the CSA code 220 when the first degrade state is reached, indicating that the primary cooling system is not functioning normally. When it has been determined that this degrade state is due to a failure of the cooling hardware, the PCC 210 sets a fault flag for the primary cooling system, which is not removed until the primary cooling system is repaired. The PCC 210 posts this interrupt to the CSA code 220.

The PCC 210 automatically turns on the backup cooling blowers or cooling fans 254 if the temperatures are above acceptable levels for the primary cooling system. The fan speeds are controlled in such a manner that the MCM temperature will not oscillate between cooling states unless the room ambient also oscillates.

The PCC 210 turns on the backup cooling blowers 254 at a speed to provide a temperature sufficiently above the temperature the first degrade state occurred so as to prevent "cooling state oscillation" when the backup blowers 254 are first turned on generally indicated at 298. Steady state air cooling mode will be in degrade one or a slower degrade state, but if the backup blowers 254 are turned on immediately after the first degrade state is posted, the additional backup cooling may cause a temporary spike down into the normal range temperature only to be soon followed by revisiting the first degrade state. It will be recognized by one skilled in the pertinent art that it is advantageous to minimize the occurrences of changing degrade states.

The PCC 210 continually samples the current and voltage being used by each MCM and communicates this power data to the MRU code as MCM powers state 284. The PCC 210 also suitably adjusts the power supply voltage levels at 296 being applied to the circuits. Raising the voltages will offset some of the speed lost by higher operating temperatures for some servers still operating in a safe temperature range and with extra power available from the power supply. For an MCM within server 240 which is operating near its upper temperature limit or for which the power supply has no additional current to supply, the PCC 210 either leaves the voltage unchanged or lowers it to reduce leakage currents in CMOS circuits. Hence, by sensing MCM temperatures and current being used by the MCM, the PCC 210 determines what if any voltage adjustment is suitable.

At all times, the existing temperatures and voltage conditions together define a suitable "thermal state" or range within which a specific set of clock speeds is optimum. The PCC 210 notifies the CSA code 220 of the proper speed range or "thermal state" that the MCMS are operating in at all times at 292. This speed range may also be called a degrade state as described above.

The PCC 210 maintains a cooling state for each MCM available for the CSA code 220 to monitor at any time. The PCC 210 also provides periodic redundancy checks to insure that the backup blowers 254 operate properly. When the primary cooling source having a fault, such as an MRU, is repaired, the PCC 210 clears defect status registers set which are visible to the CSA code 220. Likewise, the PCC 210 also sends an interrupt to the CSA code 220 if the primary cooling system, e.g., MRUs 250, 252, needs service.

The Cycle Steering Application (CSA) code 220 provides a fail-safe method of adjusting the clock speeds in an optimum manner when the cooling state changes. This method of clock speed adjustment includes determining if a cooling failure has been repaired prior to increasing the clock speeds to prevent oscillating clock speeds. It should be noted that the clock speed follows the temperature and voltage conditions at all times. Further, the time from a change of circuit temperature to a corresponding change in clock speed is slow enough that the temperatures of the circuits change minimally, less than about 1° C., during this process.

Figure 7:
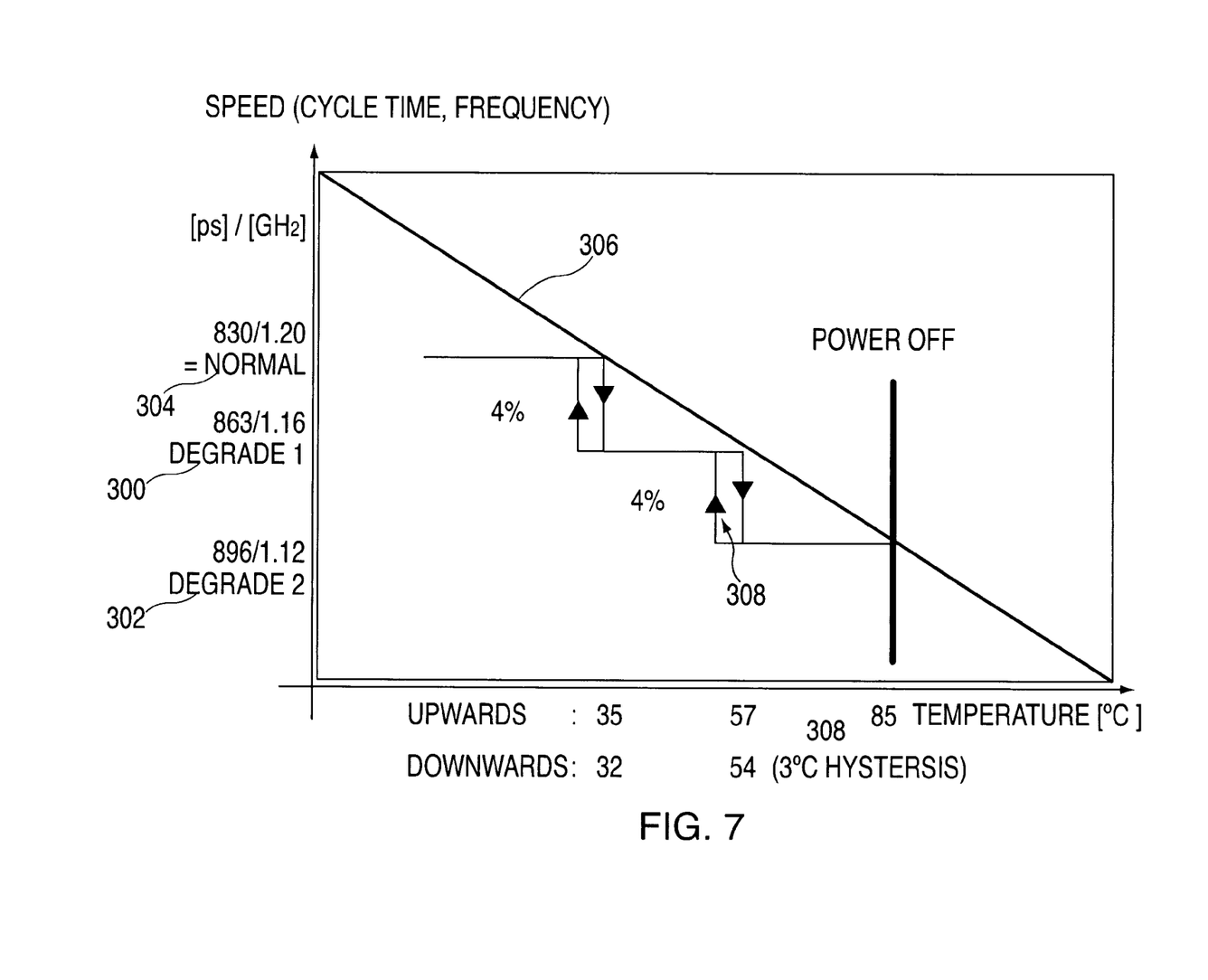
FIG. 7 is a plot illustrating two degrade states and a normal state, each set at 4% different clock speeds in accordance with an exemplary embodiment of the invention.

The plot with respect to FIG. 7 shows such an example where there are two degrade states 300 and 302, respectively, plus a normal state 304, each state 300, 302, 304 set at 4% different clock speeds. A bold line 306 delimits an "off specification" or power off from an operable range and declines about 1.6% per 10° C. FIG. 7 also illustrates that each of the temperature ranges defining these cooling states have hysteresis built in to prevent oscillation between clock speeds shown generally at 308. For example, but not limited to, the hysteresis illustrated is about 3° C. in each degrade state.

The CSA code 220 includes an interrupt handler that reads directly from the PCC 210 the cooling state of each MCM as well as receiving interrupts on these states.

For systems with multiple processor books or nodes, the CSA code 220 determines which MCM has the slowest cooling state. This is the state that governs the safe clock speed of the system indicated generally at 310 in FIG. 4. The multiple clock boundaries on multiple oscillators with pre-defined ratios are always maintained.

The CSA code 220 determines if any cooling defective hardware registers are set whenever a cooling state is increased calling for a faster clock speed. If the hardware defect register is set, it means the cause of the cooling degradation has not yet been fixed and the change in cooling state is likely due to a transient change in ambient or other transient conditions. Hence the server clock speeds are not readjusted faster until the defective cooling hardware is replaced and the register cleared. This is true even after the machine is re-initial microcode loaded (reIMLed) or rebooted. If there is uncertainty in the cooling state due to communication problems, the slowest, safest cooling state is employed by the CSA code 220.

When the CSA code 220 determines it is appropriate to make a change in several clock speeds, it alters the phase lock loops (PLL) on the clock synthesizers in a sequence of very small steps until its new targeted clock speed is reached generally indicated at 312. The phase lock loops are step-wise changed always retaining the optimum operating ratio between the various clocks that may be affected. The steps are sufficiently small to pose no risk to proper operation due to change in clock ratios during this adjustment process.

Every step is performed in a two step commit algorithm, e.g., the current step and next step PLL values are saved in a persistent storage concept made up by using SEEPROMS residing on the current and backup cage controller 260, 262. After the change is written to the PLL and read back for verification, the saved current value is updated. This is done to provide protection in case a speed change is interrupted by a cage controller switchover.

The width of the small steps taken on the phase lock loops is less than the normal jitter of the phase lock loop normal output. This allows the step variation not to be detected by the target clock receiving circuitry. In this manner all of the affected clocks are stepped in small increments until the targeted clock speed is achieved.

The PLLs are on two oscillator cards 263, one in charge, one in backup mode. At all times the optimum ratio between clocks is maintained as the phase lock loops are moved in minimal increments or decrements.

Prior to power good time, the CSA code 220 issues a "Pre-Cooling" command to insure that the MCM temperatures are in proper normal state prior to turning on the clocks. This also prevents a sudden surge of power from the CMOS logic beginning to switch. Without pre-cool, this could cause a quick degrade state to occur because the refrigerant system takes some time to get its cooling cycle established. When pre-cooled state is reached the PCC 210 notifies the CSA code 220 of the same and IML is initiated.

The PLLs are initially loaded with a pattern, which is hard wired on the cards and loaded in parallel at power good time. Normally, PLLs are loaded serially, but this is exposed to shift errors which would lead to wrong clock speed settings.

The exact process of initializing clocks includes first verifying the right oscillator card 263. Then, the pattern matching the actual system speed is loaded into the line drivers and read back to insure that there are no errors or hardware failures. Next, the loaded and verified pattern is read into the phase lock loops, with this pattern again read back to be verified. Now the system clock is started using the phase lock loop output as input. At the completion of IML, the system is degraded to its slowest clock state and upgraded back to its normal state with the required number of small incremental steps to the phase lock loops. This assures that all necessary patterns can be loaded into the phase lock loops without system error. This process takes a fraction of a second to complete on every server that is IMLed.

The pattern to be loaded for speed adjustment purposes such as when going from one cooling state to another is generated by a set of digital input/output lines controlled by hardware residing on the ocillator card 263, which is conected to the cage controller (cc) hardware. The digital input/output lines are connected to the PLLs that control the system oscillators 263. They are CSA code driven which is running on the PU Book 0 cage controller. Before changing the lines settings are saved in order to be able to detect ad correct interrupted process.

The CSA code 220 issues a warning service reference code (SRC) to the operator whenever the CSA code leaves normal clock speed. When the service is completed, the PCC 210 removes the error status and interrupts the CSA code 220. The CSA code 220 removes SRC once notified.

The CSA code 220 monitors the actual speeds used for an IML to assure these speeds are never increased in actual operation even though the cooling state later permits the increased speed. The reason for this is that the initialization of "Elastic Interfaces" (EI) done during IML allows only for speed reduction and its clearing, not faster speeds than those present during IML initialization and self-tests.

Hence, the CSA code 220 notifies the operator that re-IML should be avoided while a cooling failure service register is flagged so that when the cooling hardware problem is repaired, the server can return to its fast normal speed without needing a subsequent re-IML. Also contemplated is a repair and verify procedure that verifies that the clocks have returned to full speed while a customer engineer is present.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method to determine an optimum common clock speed for a server including multiple logic module each module being cooled by a cooling system, the method comprising:
   determining a thermal state of each logic module of the multiple logic modules, each thermal state defined by a discrete temperature range; and
   determining the optimum common clock speed based on module thermal states, self-test clock speeds, power state and cooling system repair status.

2. A method to determine a proper clock cycle time for multiple logic modules with different heat loads, the method comprising:
   determining a thermal state of each logic module of the multiple logic modules, each thermal state defined by a discrete temperature range associated with a clock speed predetermined to be a proper clock cycle time for the temperature range;
   determining whether a primary cooling means has been repaired; and
   controlling a fan speed of the backup cooling fan to prevent oscillation between thermal states.

3. A method to determine a proper clock cycle time for multiple logic mondules with different heat loads, the method comprising:
   determining a thermal state of each logic module of the multiple logic modules, each thermal state defined by a discrete temperature range associated with a clock speed predetermined to be a proper clock cycle time for the temperature range;
   determining whether a primary cooling means has been repaired, and
   increasing a voltage applied to a logic module to optimally use at least one of available cooling and power when operating in a backup cooling mode for maximum clock speed at a given temperature.

4. A method to determine a proper clock cycle time for multiule logic modules with different heat loads, the method comprising:
   determining a thermal state of each logic module of the multiple logic modules, each thermal state defined by a discrete temperature range associated with a clock speed predetermined to be a proper clock cycle time for the temperature range;
   determining whether a primary cooling means has been repaired;
   decreasing a voltage applied to a logic module when operating in a backup cooling mode and at least one of cooling or power is unavailable to reduce leakage currents that warmer degraded temperatures generate.

5. A method to determine a proper clock cycle time for multiple logic modules with different heat loads, the method comprising:
   determining a thermal state of each logic module of the multiple logic modules, each thermal state defined by a discrete temperature range associated with a clock speed predetermined to be a proper clock cycle time for the temperature range;
   determining whether a primary cooling means has been repaired;
   wherein said determining a thermal state of each logic module of the multiple logic modules is done through redundant thermal sensors directly monitoring a region representative of circuit temperatures of a corresponding logic module to provide at least one of thermal protection and redundancy to guide cooling control.

6. The method of claim 5, wherein the region corresponds with one of a hat, substrate, and individual chips of a multi chip module (MCM).

7. The method of claim 5, wherein the thermal sensors are compared for at least one of miscompare properties and insanity limits to check accuracy of each measured temperature.

8. The method of claim 7, wherein the thermal sensors include a first thermal sensor sensed by the refrigerant unit and second and third thermal sensors read by a power supply supplying power to the multiple logic modules to insure at least one of full redundancy and accuracy.

9. The method of claim 8, wherein the second and third thermal sensors are compared to each other and to the first thermal sensor, the second and third thermal sensors providing thermal protection of the multiple logic modules by dropping power if at least one of second and third thermal sensors indicate a temperature corresponding to a damage limit.

10. A method to determine a proper clock cycle time for multiple logic modules with different heat loads, the method comprising:
    determining a thermal state of each logic module of the multiple logic modules, each thermal state defined by a discrete temperature range associated with a clock speed predetermined to be a proper clock cycle time for the temperature range;
    determinig whether a primary cooling means has been repaired;
    operating the backup air cooling fans in a manner to insure that the fans always turn on even if the primary cooling means has failed; and
    operating the backup air cooling fans in a manner to insure that the fans do not come on so soon as to cause an oscillation of a cooling state when the primary cooling means has failed.

* * * * *